United States Patent [19]
Boer et al.

[11] Patent Number: 4,678,542
[45] Date of Patent: Jul. 7, 1987

[54] SELF-ALIGNMENT PROCESS FOR THIN FILM DIODE ARRAY FABRICATION

[75] Inventors: Willem D. Boer; Atsushi Kawasaki, both of Troy, Mich.

[73] Assignee: Energy Conversion Devices, Inc., Troy, Mich.

[21] Appl. No.: 889,159

[22] Filed: Jul. 25, 1986

[51] Int. Cl.[4] .................. B44C 1/22; C03C 15/00; C03C 25/06
[52] U.S. Cl. .................. 156/659.1; 29/572; 29/591; 156/653; 156/657; 156/661.1; 156/668; 357/4; 357/65; 427/88; 430/313; 430/317
[58] Field of Search ............. 156/644, 653, 655, 657, 156/659.1, 661.1, 662, 668; 350/330; 357/4, 65, 15, 72, 73, 76, 29, 30; 427/88-91; 430/313, 317; 29/571, 572, 577 C, 578, 588, 591

[56] References Cited

U.S. PATENT DOCUMENTS

| | | | |
|---|---|---|---|
| 3,442,647 | 5/1969 | Klasens | 29/578 X |
| 4,381,341 | 4/1983 | Przybysz et al. | 156/661.1 X |
| 4,587,720 | 5/1986 | Chemenas-Paule et al. | 29/578 |

FOREIGN PATENT DOCUMENTS 0071244  2/1983  European Pat. Off. .......... 156/659.1

Primary Examiner—William A. Powell
Attorney, Agent, or Firm—Marvin S. Siskind; Richard M. Goldman

[57] ABSTRACT

A self-alignment process for the fabrication of an array formed from a plurality of micron-scale solid state circuit elements operatively disposed upon a large area substrate. By the instant process electrical contact may be established with the upper electrode of the micron-scale solid state circuit elements without the necessity of masking.

24 Claims, 15 Drawing Figures

SELF-ALIGNMENT PROCESS FOR THIN FILM DIODE ARRAY FABRICATION

FIELD OF THE INVENTION

This invention relates generally to semiconductor device fabrication and more particularly to large area arrays of thin film, solid state diodes fabricated by a process which substantially reduces the necessity for precision mask alignment steps.

BACKGROUND OF THE INVENTION

Semiconductor devices, particularly those semiconductor devices formed of a plurality of discrete or electrically interconnected micron-scale, solid state semiconductor elements such as transistors, diodes and the like may be rapidly fabricated by high volume processing techniques which combine steps of photolithography and chemical etching to create preselected patterns of semiconductor alloy material, electrically insulating material and electrically conducting material. These materials cooperate to define various arrays of said discrete or electrically interconnected solid state semiconductor elements.

Typically, such micron-scale semiconductor elements are fabricated by successively depositing and pattern-wise etching various component layers of the materials which combine to form the device. The method of patterning usually includes a photolithographic step by which a protective pattern of photoresist material is provided in intimate contact with a layer of metallic, semiconductor or insulator material so as to define the desired pattern thereof. Subsequently, the entire body of photoresist patterned material is exposed to an etching reagent which may be an aqueous, gaseous or ionic etchant, said etchant functioning to remove the material which is not protected by the photoresist. In subsequent steps, the protective photoresist pattern may be stripped away and further patterned layers may be provided atop the previously patterned layers so as to form the desired device configuration.

In order to provide the photoresist material in the appropriately patterned configuration, photomasking steps are typically employed. In some instances, a mask akin to a photographic negative, having the precise pattern to be formed is typically disposed in superposed and contacting relationship to a photoresist coated layer. The photoresist is then exposed through the mask to radiation which alters its physical properties such that upon subsequent development and processing, the photoresist material is removed in a pattern-wise manner.

In a variant of this process, a mask is placed in a projector and the masking pattern is projected onto the photoresist layer by a noncontact technique, after which the same development steps as outlined for the negative photoresist are utilized. It should be readily appreciated that precise placement of the photolithographic pattern is essential in order to achieve micron-scale device geometry which provides 100% yields. Furthermore, when several photolithographic steps must be sequentially carried out on superposed layers, the relative positioning of the various patterns, generally referred to as registration, becomes increasingly difficult and susceptible to incremental errors.

As alluded to hereinabove, problems of pattern alignment and registration are particularly critical for the production of micron-scale solid state semiconductor elements such as those encountered in integrated circuits or in high density device arrays. Alignment and registration becomes correspondingly difficult and particularly critical as the size of the semiconductor device and the number of small area circuit elements increases. Further, requirements of alignment and registration impose severe cost restrictions in terms of both time and money which must be considered in deciding whether the fabrication of such semiconductor devices is economically feasible. Mask aligning equipment capable of providing the requisite accuracy is quite expensive as well as being difficult and time consuming to operate.

Flat panel displays represent one type of semiconductor product which operates at low voltages with low power consumption. Such displays accordingly enjoy a rapidly expanding market forecast for uses such as computer display terminals, television sets, instrument panels and any other such application in which graphic information must be displayed. High resolution is obviously an essential feature which must be incorporated in such displays in order for the forecasted market potential to become a reality. One way of achieving the requisite degree of resolution is by utilizing active matrix, liquid crystal display technology. For purposes of the subject application, the term, active matrix will mean an array of small area picture elements, each of which incorporates a solid state semiconductor switch therein. By utilizing such active matrix technology, the amount of charge at any given picture element or pixel can be precisely controlled with concommitant control of the transmittance or reflectance of light at that pixel so as to produce high resolution large area displays with gray scale and color capability. To be of practical use, flat panel display devices must be fabricated with a relatively large surface area, typically 400 $cm^2$ or more. Since, in active matrix technology, each of the pixels of a large area device, will include a switching element, it should be appreciated that a number of photolithographic masking and etching steps must be utilized in a high yield manner in order to fabricate and electrically interconnect those switching elements.

Another technology utilizing large area arrays of solid state circuit elements is that of photosensors. While single discrete diode or transistor elements may be utilized to sense the presence, absence or level of illumination incident thereupon, such devices are even more useful when arranged in linear or two dimensional arrays. By utilizing an array of such solid state circuit elements, large area image scanners may be fabricated which are capable of sensing patterns of illumination. Obviously, such scanner devices have great economic potential for use in facsimile devices, copying machines, page readers, computer input devices as well as other data reading applications. Image scanners are basically a large array of photosensing elements electrically interconnected by associated circuitry for the reading, processing and generating of digital signals.

Large area arrays of solid state semiconductor devices such as those used in active matrix liquid crystal displays and in photosensors require extremely high accuracy of alignment in the photolithographic mask steps by which the micron-scale solid state circuit elements are fabricated on a substrate of up to 400 square centimeters in surface area. Minute errors in alignment multiplied over the large surface area can result in the fabrication of an inoperative overall device. One particular solid state circuit element which is commmonly utilized in large area display and sensor arrays is a thin film diode which includes two metallic electrodes having operatively disposed therebetween a sandwich comprised of at least two superposed layers of thin film semiconductor alloy material. When disposed in array form, such solid state circuit elements typically have at least a top surface thereof covered by a thin insulating layer formed of silicon oxide, silicon nitride or other such dielectric material. The insulating layer includes a centrally located contact hole therein, through which electrical connection is established to the electrode of the micron-scale diode element. In such arrays, the most critical alignment step is, in general, the fabrication of the contact holes through the top insulating layer. For example, when the surface area of each of the diode elements is on the order of 20×20 microns and the contact hole is on the order of 10×10 microns and centrally located atop the diode elements, an alignment accuracy of ±5 microns is necessary to assure fabrication of a useful element. Obviously, such high degrees of accuracy are difficult to attain and maintain over the surface of devices which may be 400 square centimeters. The situation is further complicated by the fact that because of the interrelationship of the diode elements, 100% yield is required. It should therefore be readily apparent that either the elimination of the alignment step or the relaxation of these alignment tolerances would result in improved device yields and decreased production costs.

One approach to the problem of alignment in arrays of solid state, micron size diode elements involves the use of a cross-over structure, in which a large body of semiconductor alloy material is sandwiched between a matrix of electrode forming lines disposed in two parallel, but vertically intersecting planes. While the semiconductor alloy material is disposed everywhere between the two planes, it effectively forms diodes only at those cross-over points at which the electrode lines intersect, owing to the relatively high lateral resistivety of the thin film semiconductor alloy material so employed. Such a cross-over device requires only two masking steps, for the formation of the two planar arrays of electrically conductive lines. Furthermore, high degrees of misalignment can be tolerated. There are however, several drawbacks to such a configuration. Since the body of semiconductor alloy material is disposed immediately beneath an upper plane of electrodes, some current spreading can occur, particularly if certain of the layers from which the body of semiconductor alloy material are relatively highly doped (and hence more conductive). Current spreading can establish a shunt path which deteriorates device performance, and when the spacing between adjacent electrode lines in a plane is micron-scale, can also initiate cross-talk. Furthermore, many semiconductor films are light sensitive, i.e., they are photoconductive, and in such instances no portion of the semiconductor alloy body of the cross-over diode structure can be exposed to illumination because the inherent photoconductive characteristics of the semiconductor would cause it to become more highly conductive, thereby further increasing shunt current paths and cross-talk.

Various other methods have been implemented toward the objective of eliminating masking steps in the production of arrays of micron-scale circuit elements on large area substrates. For instance, processes have been implemented by scientists working with the fabrication of thin film, solid state transistor elements in which one or more of the electrode members serves as a mask for superjacent photoresist layers. In this manner, the photoresist may be patterned without the use of an external mask, thereby providing for substantially unerring alignment and 100% yields in the processing step. Such techniques are referred to as self-masking or self-aligning processes. Such techniques for transistor fabrication are disclosed, for example, in a paper entitled "A Self Alignment Process For Amorphous Silicon Thin Film Transistors". *IEEE Electron Device Letters.* Vol. EDL-3 no. 7. July 1982. pp. 187–189 by Kodama. et al. and in a paper entitled "a-Si: H TFT: Potential Suitabilities for Gate and Source-Drain Self-Aligned Structure". *Mat. Res. Soc. Symp. Proc.* Vol. 33 (1984) pp. 281–285 by *B. Diem. et al.*

While the techniques disclosed in the foregoing publications are useful for the fabrication of amorphous thin film transistors, they do require that the radiation utilized to activate the photoresist be projected through the body of amorphous silicon semiconductor alloy material. This presents problems insofar as most photoresists are exposed with near ultraviolet radiation, typically radiation of approximately 360 nanometers. Such radiation is very strongly absorbed by amorphous silicon alloy materials and consequently, long exposure times and high energy fluxes must be utilized, which radiation wave-lengths and power levels can, in some cases, damage the semiconductor alloy material from which the transistors are fabricated.

Therefore, a process is needed for the fabrication of large area arrays of solid state, micron-scale circuit elements, which process does not necessitate precise mask alignment or registration steps and which process does not necessitate the projection of relatively high levels of radiation through the semiconductor alloy material from which the devices are fabricated. Such a technique could be utilized with great advantage in the fabrication of large area arrays of photosensors as well as for fabrication of large area thin film liquid crystal displays.

As mentioned hereinabove, large area displays are particularly prone to loss of operational efficiency due to the presence of defective discrete circuit elements therein, such as defective elements resultant from misalignment of masks. While in many solid state semiconductor arrays, yields of usable circuit elements of 90–95 percent are sufficient, the constraints upon liquid crystal displays are far more severe. A single defective pixel in a display device will result in a flaw immediately and glaringly visible to the user of thereof. Such flaws may be aesthetically displeasing and, in the instances where critical data is being transmitted, may be of significant importance. In a typical liquid crystal display device, a yield of 99.995% is unacceptable. Just as a chain is only as strong as its weakest link, a liquid crystal display is limited by the performance of its weakest picture element; consequently, nothing but 100% yield of reliable micron-scale solid state circuit elements is tolerable.

The instant invention provides a method for the fabrication of arrays of solid state circuit elements formed of semiconductor alloy material, which method eliminates a critical, precision masking step. For example, by utilizing the method of the instant invention, an array of diode circuit elements may be manufactured utilizing only two patterning masks. In contrast, prior art methods utilized three or more such masking steps and since the cumulative effect of errors resultant from masking rises exponentially, it should be evident that the elimination of even a single masking step significantly improves the yields of useable circuit elements.

According to the techniques disclosed herein, a large area semiconductor device formed from an array of discrete solid state, micron-scale circuit elements may be fabricated by a process in which portions of those elements being fabricated function to mask overlying photoresist layers for purposes of patterning an insulating oxide film disposed thereupon. Since the circuit elements are discrete, and since the portions of the oxide film being patterned overlie substantially all of the circuit elements, the radiation utilized to activate that photoresist need not penetrate through the body of semiconductor alloy material of the elements, but may merely pass through the interstitial portions of the substrate which have no semiconductor alloy material deposited thereupon. In this manner, attenuation of the activating radiation by the body of semiconductor alloy material and possible damage to that semiconductor alloy material by the radiation is eliminated.

These and other advantages of the instant invention will be apparent from the claims, the drawings and the detailed description thereof which follows.

BRIEF SUMMARY OF THE INVENTION

There is disclosed herein a process for the fabrication of an array of micron-scale, solid state circuit elements on a first surface of a large area substrate, each of the elements of which includes a body of thin film semiconductor alloy material sandwiched between substantially aligned electrodes. The process includes the steps of providing a substrate capable of transmitting a level of radiation sufficient to activate a superposed radiation sensitive film, forming the elements such that the opacity thereof prevents the transmission of a level of radiation capable of activating a superposed radiation sensitive film, depositing a thin insulating film over the element and interstitial substrate, depositing a radiation sensitive film over the thin insulating film, irradiating the entirety of the surface of the large area substrate opposite the first surface, developing and processing the activated radiation sensitive film so as to expose a substantial portion of insulated film overlying the element, and etching the exposed insulating film so as to expose a substantial portion of the electrode overlying the elements. In this manner, an electrical contact to the upper electrode may be established without the necessity of masking.

The solid state circuit element is preferably a diode, such as a p-i-n diode, a Schottky diode or any other type of two terminal circuit element. The solid state circuit element could also be formed as a three-terminal element in which an intermediate electrode is provided in the body of semiconductor alloy material.

The semiconductor alloy material from which the diode is formed can be fabricated from a host matrix of amorphous silicon, a host matrix of germanium, a host matrix of amorphous silicon and germanium, or a host matrix of a chalcogenide material such as tellurium or selenium. The process may also include the further step of forming the electrodes of the diode from a metallic material such as an oxide of tin, zinc or indium. The substrate is preferably formed from a transparent material such as glass or a synthetic plastic resin which will not outgas during the deposition of the semiconductor alloy material thereupon. The radiation sensitive material may either be a positive photoresist or a negative photoresist. In either case, the radiation sensitive material is irradiated with actinic light.

The upper electrode of each solid state circuit element must be electrically contacted with a circuit line. The insulating film is preferably formed from an oxide or nitride of silicon. In the preferred embodiment, each of the solid state circuit elements has a maximum dimension of under 100 microns and preferably 20-30 microns: with only the central 8-15 micron portion of the upper electrode thereof being electrically contacted.

DETAILED DESCRIPTION OF THE INVENTION

Figure 1:
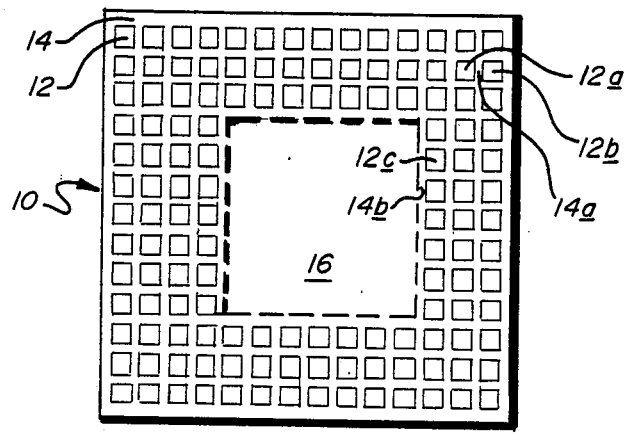
FIG. 1 is a top plan view illustrating, in stylized format, a plurality of regions of the micron-scale, solid state circuit elements of the subject invention arranged in a predesired configuration on the first surface of a transparent substrate.

Referring now to FIG. 1, there is shown a large area semiconductor device 10, stylistically representative of devices which may be fabricated in accord with the principles of the instant invention. The device 10 is an array of small area (i.e., typically micron-scale) circuit elements 12, disoosed upon a large area substrate 14. Each of the circuit elements 12, is a solid state semiconductor device, which includes a body of thin film material sandwiched between substantially aligned electrodes. The thin film material may be a semiconductor material or a insulating material and the electrodes may be fabricated from a wide variety of conductive materials such as metals, degenerate semiconductors and the like, including transparent conductive oxides of metal such as tin, zinc, indium or indium tin alloys.

The circuit elements 12 comprising a large area device array 10 may all be identical elements, or they may be different elements. Some typical circuit elements 12 which may be utilized to form the large area array 10 include diodes, such as p-n diodes, Schottky diodes, m-i-s diodes and p-i-n diodes, as well as n-i-p devices n-pi-n devices, capacitors, resistors and other two terminal devices. Similarly, the circuit elements 12 may also be three terminal devices in which case an intermediate electrode will be provided within the body of material disposed between the first and second electrodes.

It will be noted from the figure that a large central area 16, of the array 10 is devoid of small area circuit elements. This is meant to depict the fact that various arrays may include such areas which may be otherwise used for establishing electrical interconnections, mounting other electronic devices so as to create hybrid circuits, mechanical affixing of the array to circuit boards and the like. It should of course be noted, that the various device arrays which may be manufactured in accord with the principles of the instant invention need not include such open areas, but may be covered entirely with smaller area circuit elements 12. While not illustrated in the figure, the array 10, will generally include current carrying structures such as bus bars for establishing electrical communication both with, and between the circuit elements 12.

It should also be noted, that as referred to herein, the term "interstitial surface of the substrate" is meant to refer to those portions of the substrate 14 disposed between closely spaced circuit elements 12. For example 12a and 12b are two circuit elements disposed in side by side relationship. The region of the substrate therebetween 14a will thus be referred to as the interstitial portion or surface of the substrate. Likewise, circuit element 12c is disposed upon the periphery of the open area 16 and that portion of the substrate 14 proximate thereto, 14b, will similarly be referred to as an interstitial portion of the substrate. In general, the interstitial portions of the substrate will be those portions extending from the circuit element 12 and having dimensions roughly comparable to the dimensions of the circuit element 12 itself.

FIGS. 1A-1H will better illustrate the process steps involved in the instant invention.

Figure 1A:
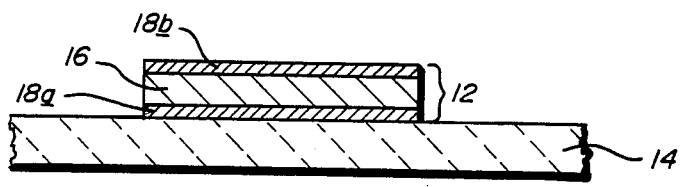
FIG. 1A is a cross-sectional side view of a portion of the device of FIG. 1 and illustrating one solid state circuit element of the subject invention disposed upon the substrate.

Referring now to FIG. 1A, there is shown a portion of the large area array 10 of FIG. 1, illustrating the substrate 14 having a circuit element 12 disposed upon the first surface thereof. Although the circuit elements utilized may be of any size, the benefits of the instant invention are most advantageously realized when it is utilized in the fabrication of arrays which include micron-scale elements. Accordingly the circuit element 12, of the figures will be regarded as being a 20-30 micron square device. The circuit element 12 is comprised of a semiconductor body 16 sandwiched between a first and second electrode 18a-18b. The semiconductor body 16 may be any one of a variety of thin film semiconductor materials such as silicon alloy materials, germanium alloy materials, silicon-germanium alloy materials and germanium-silicon alloy materials. Similarly, the semiconductor body 16 may also be a chalcogenide material such as a tellurium, or selenium alloy material. The semiconductor body 16, may be a single layer of material, as for example in a threshold switch or other such device or, it may be a multilayered body such as a body of p and n or p, i and n layers for the fabrication of diodes and the like. It should also be noted, that while the layer 16 is described as a semiconductor layer, the invention is not limited by the material comprising that layer. In those instances where circuit elements such as capacitors or resistors are being fabricated, the layer 16 will be a high resistivity material or, in some instances, an insulating material; therefore, while the layer 16 is referred to as a layer of semiconductor material, it should be understood that various other materials may be utilized in keeping with the spirit of the instant invention. The electrodes 18a, 18b are formed of material having good electrical conductivity. Included in such materials are metals, as well as highly degenerate semiconductor materials such as heavily doped semiconductors, or transparent conductive oxide materials such as oxides of tin, zinc, indium or indium and tin.

As mentioned previously, one problem encountered in the fabrication of arrays of circuit elements is in establishing electrical connection to the myriad of individual elements 12. The regions in which electricl communication with the individual elements 12 is to be established must be carefully and particularly defined in order to prevent short circuiting of adjacent devices as well as the establishment of unwanted connections. One preferred method of establishing electrical communication with the individual elements 12, involves masking those elements with a layer of insulating material, such as a layer of silicon oxide or silicon nitride and subsequently etching openings in the insulating layer, said openings corresponding to regions in which electrical communication is to be established. Heretofore, the process of etching the openings involved photolithographic steps requiring precise alignment of etching masks with the micron scale element 12. As mentioned hereinabove, such alignment steps are high precision operations typically involving the expenditure of much time and the use of expensive and sophisticated equipment. In accord with the instant invention, a self-aligning structure is provided whereby the necessity of masking is eliminated.

The principles of the instant invention will be explained with reference to a process for establishing an electrical contact to the top (i.e., distal from the substrate) electrode 18b of a circuit element 12.

As the first step in the fabrication of the completed array, circuit elements 12 are disposed upon the substrate 14 by conventional techniques well known to those skilled in the art such as for example, vacuum deposition, masking and etching. The only criteria for the circuit elements and substrates utilized in the practice of the instant invention are that the substrate 14 be relatively transparent to radiation of a wavelength and/or intensity capable of activating a film of a radiation sensitive material utilized in processing steps to be discussed subsequently and that the circuit element itself be of an opacity which prevents transmission of a level of radiation capable of activating the radiation sensitive material. While the material of the substrate 14, will depend upon the radiation employed, it has been found that glass quartz, sapphire, alumina and synthetic polymers all combine durability with transparency and hence may be utilized in the instant invention. There are a wide variety of circuit elements which may be utilized since only the semiconductor body 16 or one or both of the electrodes 18a, 18b need be relatively opaque.

Figure 1B:
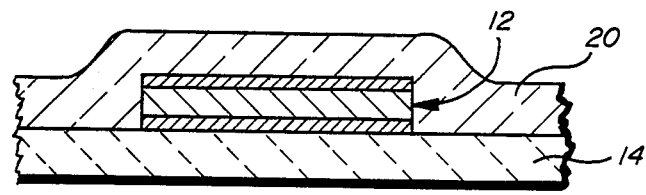
FIG. 1B is a cross-sectional side view of the circuit element of FIG. 1A illustrating an insulating layer deposited thereover.

In the second step of the process, as shown in FIG. 1B a layer of insulating material 20 is deposited over the circuit element 12 and at least the interstitial portions of the substrate 14. As mentioned previously, the insulating film 20 may comprise any insulating material utilized in the fabrication of semiconductor devices such as silicon oxide, silicon nitride, organic insulators and the like. Deposition of the insulating film 20 may be accomplished by any technique well known to those skilled in the fabrication of semiconductor devices such as chemical vapor deposition techniques, vacuum deposition techniques, spray coating techniques, spin coating techniques and the like.

Figure 1C:
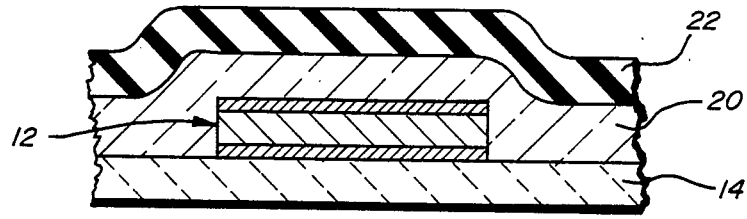
FIG. 1C is a cross-sectional side view of the circuit element of FIG. 1B illustrating a radiation sensitive film disposed over the insulating layer.

In the next processing step, depicted in FIG. 1C, a radiation sensitive film 22 is deposited over the thin insulating film 20. This radiation sensitive film 22 is typically formed of material referred to as "photoresist". Photoresist materials are widely used in graphic arts and semiconductor device fabrication for purposes of producing desired patterns. The typical photoresist material is an organic polymeric material which is sensitive to activating radiation, typically radiation in the actinic (i.e. violet and ultraviolet) portions of the spectrum. Typical photoresist materials are based upon organic molecules such as poly-vinyl cinnamate, and have their physical properties changed by irradiation. In positive working photoresist materials, portions thereof which are activated by radiation become degraded and hence susceptible to removal by solvents in subsequent developing and processing steps. Negative working photoresists are cross-linked by exposure to radiation and consequently become less soluble in developing solvents. It may thus be seen that by exposure of photoresist materials to patterns of radiation, corresponding regions of underlying material may be selectively exposed or covered. The instant invention may be practiced with both positive and negative working photoresist materials. For clarity of discussion, the utilization of a negative working photoresist material will be discussed first and the corresponding process utilizing positive working photoresist will be discussed subsequently. There are a wide variety of negative working photoresist materials available, all of which may be advantageously utilized in the instant invention. One material having particular utility is Kodak Microresist 747 photoresist manufactured by Eastman Kodak.

Once the radiation sensitive film 22, in this instance of negative working photoresist, is deposited, the surface of the large area substrate 14 opposite the first surface of the substrate 14 is irradiated with light energy of a quality and quantity sufficient to activate the negative working photoresist material.

Figure 1D:
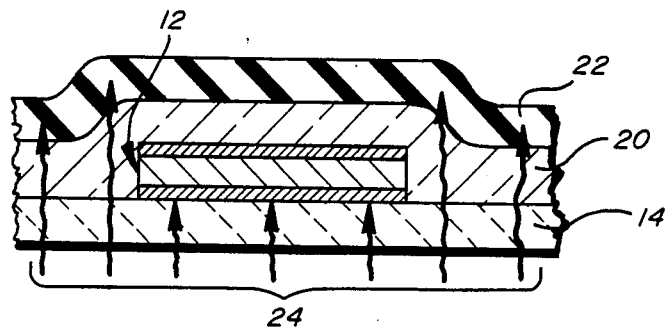
FIG. 1D is a cross-sectional side view of the circuit element of FIG. 1C illustrating radiation impinging upon the radiation sensitive film from the surface of the substrate opposite the first surface.

Referring now to FIG. 1D there is shown a flux of radiation 24, incident upon the substrate 14 of the device. It will be noted from the figure that the circuit element 12 is opaque to the flux of radiation 24 and hence shields those portions of the radiation sensitive film 22 directly superjacent. The substrate 14 and the insulating layer are not opaque and hence transmit the flux of radiation 24 therethrough to the radiation sensitive layer 22. This radiation activates the negative working photoresist in the radiation sensitive layer 22 so as to cross-link the polymeric material thereof. What is notable about this process is that the circuit elements 12 functions as its own mask and hence no separate masking step and no associated alignment step need be employed.

Subsequent to the exposure step, the radiation sensitive film 22 is developed and processed so as to expose a portion of the insulating film overlying the circuit element. Development of the radiation sensitive layer 22 will depend upon the particular material utilized to fabricate that layer. Typical photoresists are developed by immersion in a proprietary solvent mixture such as xylene or toluene based solvent system. In the case of Kodak microresist 747 negative working photoresists, development is accomplished by utilizing Kodak microresist developer. In the developing process the areas of the negative working photoresist not struck by light are dissolved away whereas the irradiated areas remain. It should be noted that, as utilized herein, the terms "processing and development" refer to development steps as well as associated washing, rinsing and drying steps by which the layer is processed so as to create a desired pattern of openings therein.

Figure 1E:
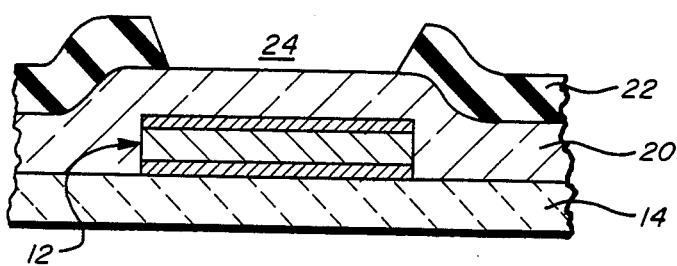
FIG. 1E is a cross-sectional side view of the circuit element of FIG. 1D illustrating the radiation sensitive film after the development and processing thereof.
Figure 1F:
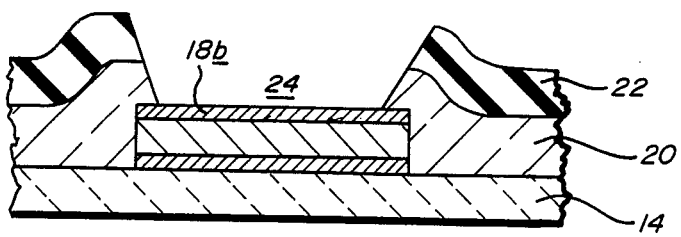
FIG. 1F is a cross-sectional side view of the circuit element of FIG. 1E illustrating the removal of the insulating layer from the top surface of the circuit element.

Referring now to FIG. 1E, there is shown the device after developing and processing of the radiation sensitive photoresist layer 22 thereof. It will be noted that there is an opening 24 in the photoresist layer 22 which exposes a portion of the insulating layer 20 corresponding to and superjacent to the circuit element 12. In the next step as depicted in FIG. 1F, portions of the exposed insulating film are etched away so as to expose the top electrode 18b of the circuit element 12. Etching may be accomplished by any technique well known to those skilled in the art and the particular conditions and reagents will depend uoon the material utilized to form the insulating layer 20. In those cases where silicon oxide is utilized as the insulating material, it has been found that etching may be advantageously accomplished by dry etching using radiofrequency energized plasmas of fluorocarbons. Similar results could also be obtained utilizing wet chemical processes utilizing buffered HF etchants, although in some instances care must be taken to avoid undercutting.

Figure 1G:
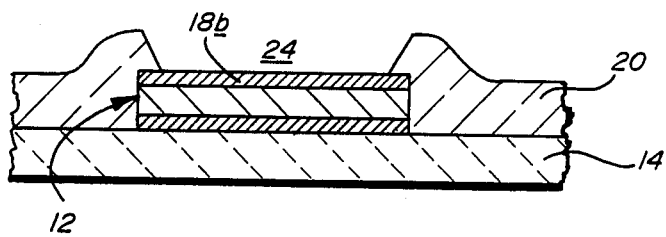
FIG. 1G is a cross-sectional side view of the circuit element of FIG. 1F illustrating the removal of the remainder of the radiation sensitive film.

In FIG. 1G, the exposed portions of the radiation sensitive photoresist layer 22 are stripped away from the remainder of the device. This stripping may be accomplished by use of proprietary reagents called photoresist strippers. These are typically phenol based solvents which remove the entirety of the cross-linked and uncross-linked photoresist material. It should be noted that in some instances, the remaining photoresist material will not interfere with subsequent processing consequently need not be removed: however, for purposes of illustration the instant invention has been depicted as including such a removal step. As shown now in FIG. 1G the device now comprises the substrate 14, the circuit element 12 and a patterned layer of insulating material 20 having an opening therein 24 through which electrical communication with the top electrode 18b of the circuit element 12 may be established.

Figure 1H:
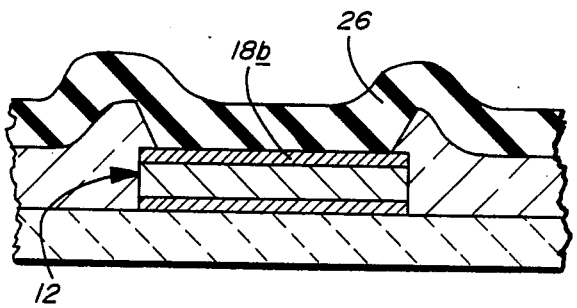
FIG. 1H is a cross-sectional side view of the circuit element of FIG. 1G illustrating the deposition thereupon of an electrically conductive layer.

In FIG. 1H, there is shown the deposition of a strip of electrically conductive electrode material 26 upon the device. The conductive material 26 may be a metallic electrode material such as a layer of chromium, or it may be a material such as a heavily doped semiconductor and the like. The electrode material 26 infiltrates the opening 24 and establishes electrical communication with the top electrode 18b of the circuit element 12. In this manner, various interconnections to the various circuit elements comprising a large area array may be established.

A similar process may be implemented utilizing positive working photoresists. Among such materials are various proprietary mixtures such as AZ1450J produced by the Shipley Corporation. For a process utilizing positive working photoresists, the steps shown in FIGS. 1A–1B will generally be repeated except that the layer of radiation sensitive material 22 will be a layer of positive working photoresists rather than a layer of negative working photoresist. Exposure to activating radiation degrades cross-links of the positive working photoresist rendering it more soluble in a developing reagent, while the unexposed portions of the photoresist remain relatively insoluble.

Figure 2E:
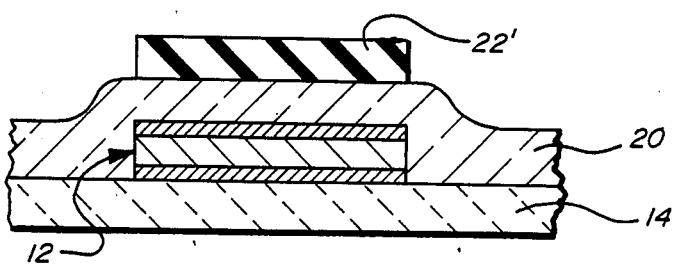
FIG. 2E is a cross-sectional side view of a circuit element generally similar to that of FIG. 1D illustrating the radiation sensitive film which remains thereatop after a development step.

Referring now to FIG. 2E there is shown a large area device array at the stage of processing immediately following development of the exposed, positive working photoresist layer. It will be noted that the device includes a substrate 14, a circuit element 12 and an insulating layer 20, generally similar to those in the foregoing example. What is notable is that the device illustrated in FIG. 2E also includes a cap of photoresist material 22' overlying the circuit element 12 and formed from photoresist material which has not been irradiated.

Figure 2F:
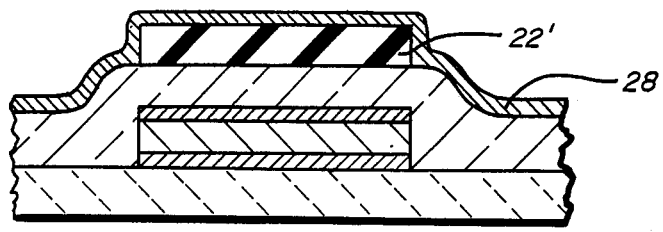
FIG. 2F is a cross-sectional side view of the circuit element of FIG. 2E illustrating a metal resist layer deposited atop the insulating material and the radiation sensitive film.
Figure 2G:
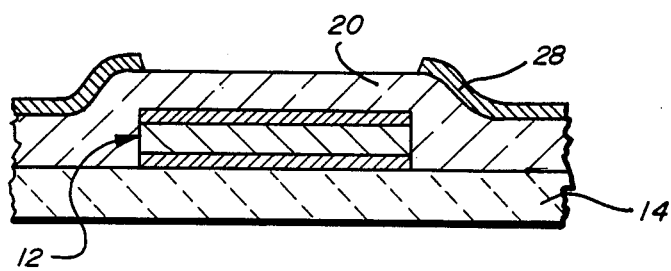
FIG. 2G is a cross-sectional side view of the circuit element of FIG. 2F and illustrating the removal of the metallic resist layer and the remaining radiation sensitive film.
Figure 2H:
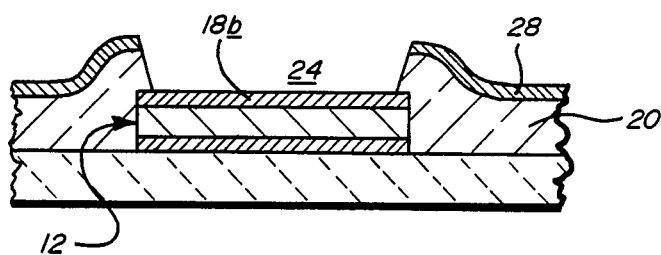
FIG. 2H is a cross-sectional side view of the circuit element of FIG. 2G illustrating the removal of the insulating layer from atop the circuit element.

Referring now to FIG. 2F, there is shown the next step in the embodiment of the instant invention utilizing positive working photoresist. In this step, a layer of etch resistant material, such as for example chromium metal 28 is deposited everywhere across the device, including the cap 22'. In the subsequent step, illustrated in FIG. 2G, conventional "lift-off" technolooy is utilized to remove the cap 22' and overlying resist layer 28. In a lift-off process, the device is exposed to a solvent capable of softening and dissolving the material forming the cap 22. This solvent infiltrates through the overlying metallic or other resist layer 28, softens and removes the material of the cap, and lifts off overlying portions of the resist layer 28. The net result is the structure depicted in FIG. 2G including a substrate 14, circuit element 12 and an insulating layer 20 which is generally protected by the resist layer 28 except in those regions directly superjacent the circuit element 12.

Figure 2I:
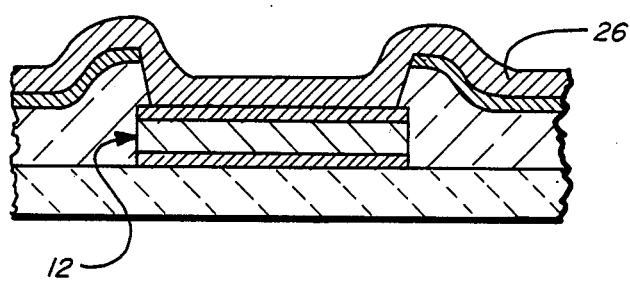
FIG. 2I is a cross-sectional side view of the circuit element of FIG. 2H illustrating the deposition thereupon of an electrically conductive circuit line.

In the next processing step, the device is exposed to an etchant reagent capable of removing the material forming the insulating layer 20, while not reacting with the material of the resist layer 28. In general, the etching techniques described with reference to the negative working embodiment may be similarly employed. In this manner, an opening 24 is created in the device establishing communication with the top electrode 18b of the circuit element 12. In the processing step illustrated with reference to FIG. 2I an electrically conductive layer 26 is deposited as in the foregoing example, for purposes of establishing electrical communication with the circuit element 12.

There are a number of photoresponsive radiation sensitive materials available to routineers for the fabrication of photolithographic patterns. The instant invention may be advantageously practiced utilizing various of such materials in accord with the principles generally detailed hereinabove. It is the essence of the instant invention that the use of a separate photomask in the processing of large scale semiconductor devices is eliminated.

Figure 3D:
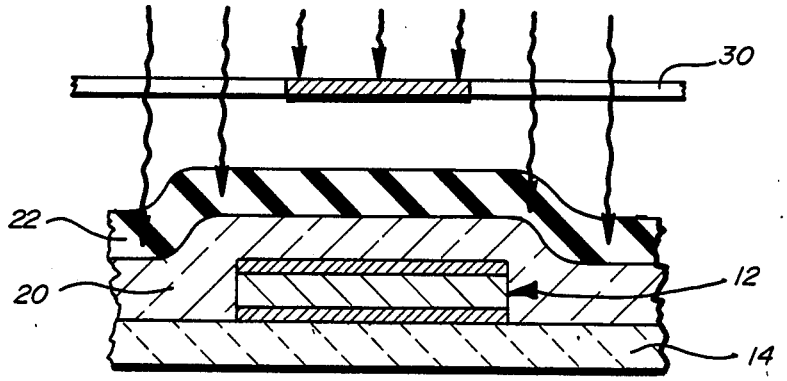
FIG. 3D is a cross-sectional side view; similar to FIG. 1D and illustrating the solid state circuit element of FIG. 1C in order to elucidate the criticality of an alignment procedure in which self alignment was not utilized.

FIG. 3D is illustrative of a prior art photomasking step. As shown, there is a portion of a device being fabricated which includes a substrate 14, a circuit element 12, a layer of insulating material 20 superposed thereupon and a layer of radiation sensitive material 22 thereatop. In this regard, the device of FIG. 3D is identical to that of FIG. 1D. Comparison of FIG. 3D with FIG. 1D will illustrate the advantages of the instant invention over the orior art. As shown in FIG. 3O, a separate photomask 30 is disposed so as to allow projection of the proper pattern of radiation upon the device being fabricated. Note that no photomask is utilized in the process illustrated in FIG. 1D, the illumination thereof being substantially uniform. While the imposition of the mask 30 may seem like a trivial step, it is time consuming and expensive. First of all, it must be kept in mind that the features of the circuit elements are of micron scale dimensions, consequently, the mask features will be of corresponding size. Such masks are expensive to fabricate and must be kept scrupulously clean. Furthermore, alignment of the mask with the underlying element must be within dimensions equal to a small fraction of the size of the circuit elements, consequently, positioning of the mask is extremely critical. As mentioned previously, the instant invention eliminates this critical, time consuming and expensive masking step.

While the instant invention has been described with reference to the creation of an array of two terminal semiconductor circuit elements, the instant invention may obviously be utilized to fabricate other types of devices and arrays. For example, the instant invention may be advantageously utilized to fabricate single discrete devices as well as arrays. Also, the instant invention may be utilized to fabricate three terminal devices, in which case a third electrode member will be disposed within the circuit element and will include its own electrical connections. The critical features of the instant invention are that the circuit elements are disposed upon a substrate capable of transmitting radiation sufficient to activate a radiation sensitive film and that the elements have sufficient opacity to prevent transmission of that same level of radiation so that the element itself functions as a self aligning mask for creation of electrical contact thereto.

The foregoing drawings, and discussions thereof were merely meant to illustrate the instant invention and not be a limitation upon the practice thereof. It is the following claims, including all equivalents which define the scope of the instant invention.

We claim:

1. In a process for the fabrication of an array which includes a plurality of micron-scale solid state circuit elements operatively disposed in a preselected pattern on the first surface of a large area substrate, said elements including a body of thin film semiconductor alloy material sandwiched between substantially aligned electrodes, the improved method including the steps of:

providing a substrate capable of transmitting a level of radiation sufficient to activate a superposed radiation sensitive film;

forming the elements such that the opacity thereof prevents the transmission of a level of radiation capable of activating a superposed radiation sensitive film;

depositing a thin insulating film over the elements and interstitial first surface of the substrate;

depositing a radiation sensitive film over the thin insulating film;

irradiating the surface of the large area substrate opposite the first surface;

developing and processing the activated radiation sensitive film so as to expose a portion of the insulating film overlying the elements; and etching the exposed insulating film so as to expose a portion of the electrode overlying the elements, whereby an electrical contact to said overlying electrode may be established without the necessity of masking.

2. A process as in claim 1 including the further step of forming the solid state circuit elements as p-i-n diodes.

3. A process as is claim 1 including the further step of forming the solid state circuit elements as Schottky diodes.

4. A process as in claim 1 including the further step of forming the solid state circuit elements as two terminal devices.

5. A process as in claim 1 including the further step of forming the solid state circuit elements as three-terminal devices in which an intermediate electrode is provided in the body of semiconductor alloy material.

6. A process as in claim 1 including the further step of forming the semiconductor alloy material of the solid state circuit elements from a host matrix of amorphous silicon.

7. A process as in claim 6 including the further step of incorporating germanium in the host matrix of amorphous silicon.

8. A process as in claim 1 including the further step of forming the semiconductor alloy material of the solid state circuit elements from a host matrix of amorphous germanium.

9. A process as in claim 8 including the further step of incorporating silicon in the host matrix if amorphous germanium.

10. A process as in claim 1 including the further step of forming the solid state circuit elements from a host matrix of chalcogenide material.

11. A process as in claim 10 including the further step of forming the solid state circuit elements from tellurium, selenium or a tellurium, selenium alloy.

12. A process as in claim 1 including the further step of forming the electrodes from a metallic material.

13. A process as in claim 1 including the further step of forming at least one of the electrodes from an oxide of tin, zinc, indium or indium tin.

14. A process as in claim 1 including the further step of forming the substrate from transparent glass or a synthetic plastic resin.

15. A process as in claim 1 including the further step of utilizing a positive photoresist as the radiation sensitive film.

16. A process as in claim 15 wherein the step of developing and processing the radiation sensitive film includes the further steps of depositing a metallic overlayer and removing the overlayer and the subjacent radiation sensitive film.

17. A process as in claim 1 including the further step of utilizing a negative photoresist film as the radiation sensitive film.

18. A process as in claim 1 including the further step of irradiating the surface of the large area substrate opposite the first surface with actinic light.

19. A process as in claim 1 including the further step of electrically contacting the upper electrode of each solid state circuit element.

20. A process as in claim 1 including the further step of forming the insulating film from an oxide or nitride of silicon.

21. A process as in claim 1 including the further step of forming each of the solid state circuit elements so as to have a maximum dimension of under 100 microns.

22. A process as in claim 21 including the further step of forming each of the solid state circuit elements so as to have a maximum dimension of 20-30 microns.

23. A process as in claim 22 including the further step of exposing only a central portion of the upper electrode of each of the solid state circuit elements.

24. A process as in claim 23 including the further step of exposing an 8-15 micron central portion of the upper electrode of the solid state circuit elements for electrical contact.

* * * * *